(12) United States Patent
Bordow

(10) Patent No.: US 7,239,256 B1
(45) Date of Patent: Jul. 3, 2007

(54) INTEGRATED CALIBRATION SOURCE AND ANALOG-TO-DIGITAL CONVERTER

(75) Inventor: Robin A Bordow, Petaluma, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/344,782

(22) Filed: Feb. 1, 2006

(51) Int. Cl.
*H03M 1/10* (2006.01)
(52) U.S. Cl. ........................... 341/120; 341/155
(58) Field of Classification Search ......... 341/118–155
See application file for complete search history.

(56) References Cited

U.S. PATENT DOCUMENTS

| | | | | |
|---|---|---|---|---|
| 6,445,317 B2 * | 9/2002 | Lundin et al. | ............... | 341/120 |
| 6,483,448 B2 * | 11/2002 | Martin et al. | ............... | 341/122 |
| 7,031,683 B2 * | 4/2006 | Vishakhadatta et al. | .... | 341/120 |
| 7,049,984 B2 * | 5/2006 | Wood et al. | ................ | 341/120 |

\* cited by examiner

*Primary Examiner*—Lam T. Mai
(74) *Attorney, Agent, or Firm*—John L. Imperato

(57) ABSTRACT

An integrated calibration source and analog-to-digital converter are referenced to an analog ground. The calibration source provides a comb spectrum established by a sequence of bits that are repeatedly played back.

18 Claims, 3 Drawing Sheets

INTEGRATED CALIBRATION SOURCE AND ANALOG-TO-DIGITAL CONVERTER

BACKGROUND OF THE INVENTION

Modern radio frequency (RF) spectrum analyzers include high speed analog-to-digital converters (ADCs) to measure signals that have high bandwidths. Some of these RF spectrum analyzers include a calibration source for calibrating responses of the ADCs and other subsystems of the analyzer over a measurement bandwidth. The calibration involves stimulating the subsystems with a calibration signal provided by the calibration source, and then synthesizing a calibration filter based on measured responses to the calibration signal. Applying the calibration filter to measurements that are subsequently acquired by the RF spectrum analyzer compensates for errors in the responses of the various subsystems to achieve high performance in the analyzer.

Achieving high performance in an RF spectrum analyzer also relies on applying the calibration signal to input circuits, down-converters, ADCs, and other sensitive subsystems of the analyzer that are referenced to a low-noise analog ground that is isolated from a noisier digital ground in the analyzer to which field programmable gate arrays (FPGAs) and other digital circuits in the RF spectrum analyzer are referenced.

Prior art RF spectrum analyzers typically include the calibration source in an FPGA that is physically separated from the ADC. This results in a corresponding physical separation between the analog ground of the ADC and the digital ground of the calibration source. Accurate calibration then relies on the calibration signal traversing the physical separation between the analog and digital grounds without adding noise to the analog ground and without degrading the quality of the calibration signal. For calibration signals that have high bandwidths, the physical separation between the analog and digital grounds that can be traversed without compromising the calibration of the analyzer is typically shorter than the distance between the calibration source and the ADC, or between the calibration source and the other subsystems to which the calibration signal is applied.

To traverse this physical separation between the grounds, prior art RF spectrum analyzers include circuitry to receive and re-transmit the calibration signal on the analog ground at positions close to where the analog and digital grounds are physically separated. The RF spectrum analyzers may also include common-mode chokes to maintain isolation between the analog and digital grounds. However, the common-mode chokes and additional circuitry associated with traversing between the analog and digital grounds typically increase the cost and complexity of the RF spectrum analyzer and can add constraints in the placement of components and subsystems within the analyzer.

The ADCs and other subsystems in RF spectrum analyzers and other high performance measurement instruments are typically more sensitive to noise on the analog ground at higher measurement bandwidths. As the trend in ADCs is toward increasing measurement bandwidths, there is a need for a calibration source that enables calibration signals to be applied to ADCs and other subsystems that are referenced to low-noise analog grounds, without adding noise to the analog grounds and without the added cost and complexity of circuitry associated with traversing physical separations between analog and digital grounds in the measurement instrument.

DETAILED DESCRIPTION

Figure 1:
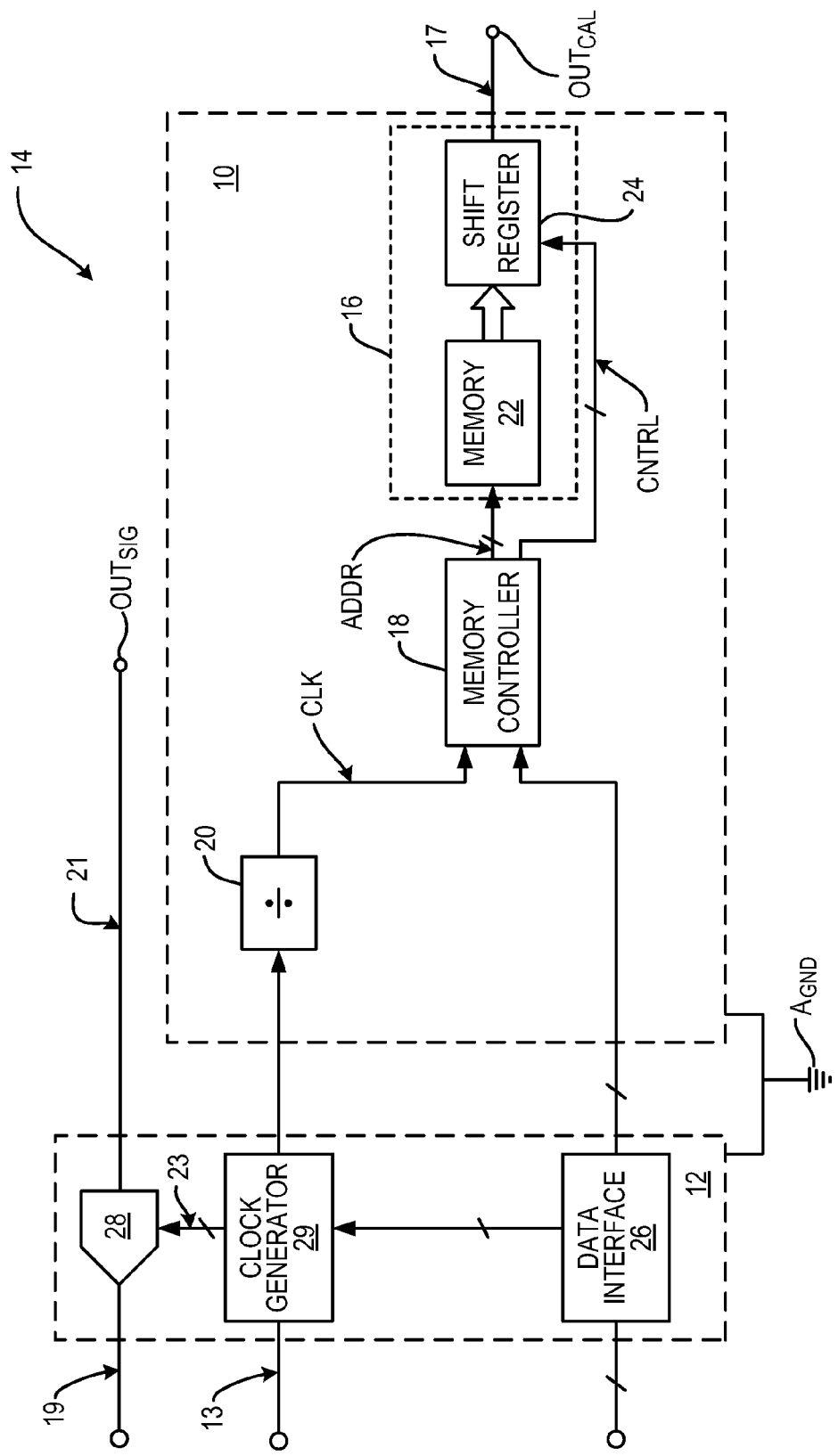
FIG. 1 shows one example of an integrated calibration source and ADC according to embodiments of the present invention.

FIG. 1 shows one example of an integrated calibration source 10 and analog-to-digital converter (ADC) 12 according to embodiments of the present invention. The calibration source 10 is shown integrated with the ADC 12 on an integrated circuit (IC) 14. The IC 14 is a formed on a silicon substrate, a gallium arsenide substrate, or on any other type of semiconductor substrate suitable for implementing and integrating the elements of the integrated calibration source 10 and ADC 12.

Figure 2:
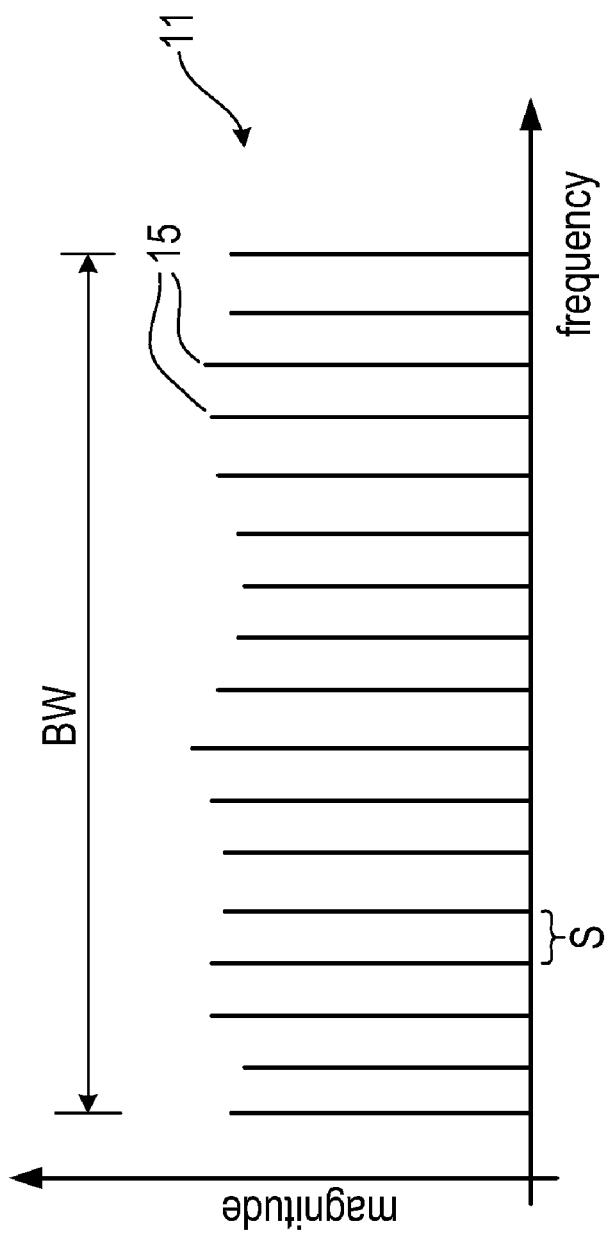
FIG. 2 shows one example of a calibration signal provided by a calibration source in the integrated calibration source and ADC according to embodiments of the present invention.

The calibration source 10 includes a calibration memory 16, a memory controller 18, and an optionally included frequency divider 20. The calibration memory 16 provides one or more repeating bit patterns at an output $OUT_{CAL}$. The repeating bit patterns can be selected or otherwise designated to form a comb spectrum 11 (shown in FIG. 2) with attributes that can be varied by adjusting sequences of bits in the bit pattern, or by adjusting a clock signal CLK provided to the memory controller 18. For example, the spacing S of spectral lines, or "teeth" 15 in the comb spectrum 11 can be designated according to the ratio of the frequency of the clock signal CLK to the number of bits in the repeating bit pattern. The bandwidth BW of the comb spectrum 11 can be designated by half of the frequency of the clock signal CLK. When the calibration source 10 includes the frequency divider 20, the bandwidth BW of the comb spectrum 11 can be varied by adjusting the frequency of an applied clock signal 13, or by adjusting the divide ratio of the frequency divider 20.

The calibration memory 16 includes a memory 22, such as a register file or other integrated storage suitable for storing one or more sequences of bits that can be repeatedly accessed and played back to establish the repeating bit patterns that form the comb spectrum 11 of the calibration signal 17. The calibration memory 16 also includes a shift register 24 that clocks in parallel bits from the memory 22 and converts the parallel bits into a serial bit stream that establishes the repeating bit patterns that form the comb spectrum 11 of the calibration signal 17.

The memory controller 18 is coupled between a data interface 26 and the calibration memory 16. The memory controller 18 includes a digital sequencer or other finite state machine that provides an address signal ADDR and a control signal CNTRL to the calibration memory 16. The address signal ADDR provides for selection of a designated one of the one or more sequences of bits stored in the calibration memory 16, typically by specifying address locations between a start and an end address location of the one or more sequences of bits stored in the calibration memory 16.

The memory controller 18 provides the control signal CNTRL to the shift register 24 within the calibration memory 16, so that the parallel bits from the memory 22 can be converted into a serial sequence of bits that can be repeatedly played back to establish the repeating bit patterns that form the comb spectrum 11 of the calibration signal 17.

The memory controller 18 also includes data registers that receive sequences of bits that are provided by the data interface 26. The memory controller 18 writes these sequences of bits to the calibration memory 16 for storage in the memory 22 as the one or more sequences of bits that are repeatedly played back to establish the repeating bit patterns that form the comb spectrum 11 of the calibration signal 17.

The sequence of bits provided by the data interface 26 is selected to provide a corresponding comb spectrum 11 with teeth 15 that have designated magnitudes and phases over the bandwidth BW of the calibration signal 17. In one example, the magnitudes and phases of the teeth 15 in the comb spectrum 11 are designated so that the repeating bit patterns that form the comb spectrum 11 have a peak-to-average power ratio that is sufficiently small to maintain linear operation of the ADC 12 and other subsystems during the application of the calibration signal 17 to the ADC 12 or other subsystems of a measurement instrument.

The sequence of bits can be selected by representing the comb spectrum with teeth of the designated magnitudes and phases, and then performing an inverse Fast Fourier Transform (FFT) on the represented comb spectrum. The resulting inverse FFT provides a time domain signal that when applied to a delta-sigma modulator generates a sequence of bits that approximates the time domain signal. While this one example of selecting the sequence of bits is provided for the purpose of illustration, alternative methods or techniques can be used to select or otherwise establish the sequence of bits that when repeatedly played back establishes the comb spectrum 11 of the calibration signal 17.

According to alternative embodiments of the present invention, the data interface 26 provides one or more sequences of word patterns to the memory controller 18. In these embodiments, the memory controller 18 writes the word patterns to the memory 22 and then selects one or more of the sequences of word patterns to be repeatedly provided to one or more digital-to-analog converters (DACs) (not shown) within the calibration source 10. The one or more DACs provide an analog signal at the output $OUT_{CAL}$ that forms the comb spectrum 1 the calibration signal 17. In this embodiment, the one or more DACs are coupled to the memory 22 of the calibration memory 16 in place of the shift register 24 that is shown in FIG. 1. Alternatively, the word patterns are repeatedly provided to one or more digital-to-analog converters that are located in subsystems that are external to the IC 14.

The frequency divider 20 optionally included in the calibration source 10 provides for a wide adjustment range to the bandwidth BW of the calibration signal 17 by corresponding adjustments or modifications to the frequency of the applied clock signal 13 provided to the IC 14. The frequency divider 20 is typically implemented with flip flops to achieve frequency division of the applied clock signal 13 by divide ratios that are integer powers of two. Programmable prescalers are alternatively included in the frequency divider 20 to provide frequency division of the applied clock signal 13 by integer divide ratios or fractional divide ratios.

The ADC 12 within the IC 14 includes a data converter 28 that receives an applied analog signal 19 and provides a corresponding digital signal 21 at an output $OUT_{SIG}$ that is a digital representation of the analog signal 19. For clarity, control circuitry for the ADC 12 has been omitted from the representation of the ADC 12 provided in FIG. 1. To achieve high data conversion rates, the ADC 12 can include multiple data converters 28 that are interleaved to accommodate applied analog signals 19 that have high bandwidths. Timing synchronization for the interleaved data converters 28 is typically provided by timing signals 23 that are provided to the data converters 28 by a clock generator 29. Interleaved data converters 28 provide the ADC 12 with data conversion rates that are sufficiently high to enable the ADC 12 to be used in a digital intermediate frequency (IF) section of a radio frequency (RF) spectrum analyzer. One example of an ADC 12 that has interleaved data converters 28 is included in the digital IF section of a model E4440 PSA, Option 122, spectrum analyzer from AGILENT TECHNOLOGIES, INC.

At high data conversion rates, track and hold circuits in the input section of the data converter 28 of an ADC are susceptable to noise and other disruptions to the analog ground $A_{GND}$ to which the ADC is referenced. These disruptions, which can reduce the measurement sensitivity of the data converter 28 and limit the accuracy of the measurement instrument within which the ADC is included, are addressed in the integrated calibration source 10 and ADC 12 according to embodiments of the present invention by integrating the calibration source 10 and the ADC 12 in the IC 14, and referencing both the calibration source 10 and the ADC 12 to the analog ground $A_{GND}$ of the IC 14.

Figure 3:
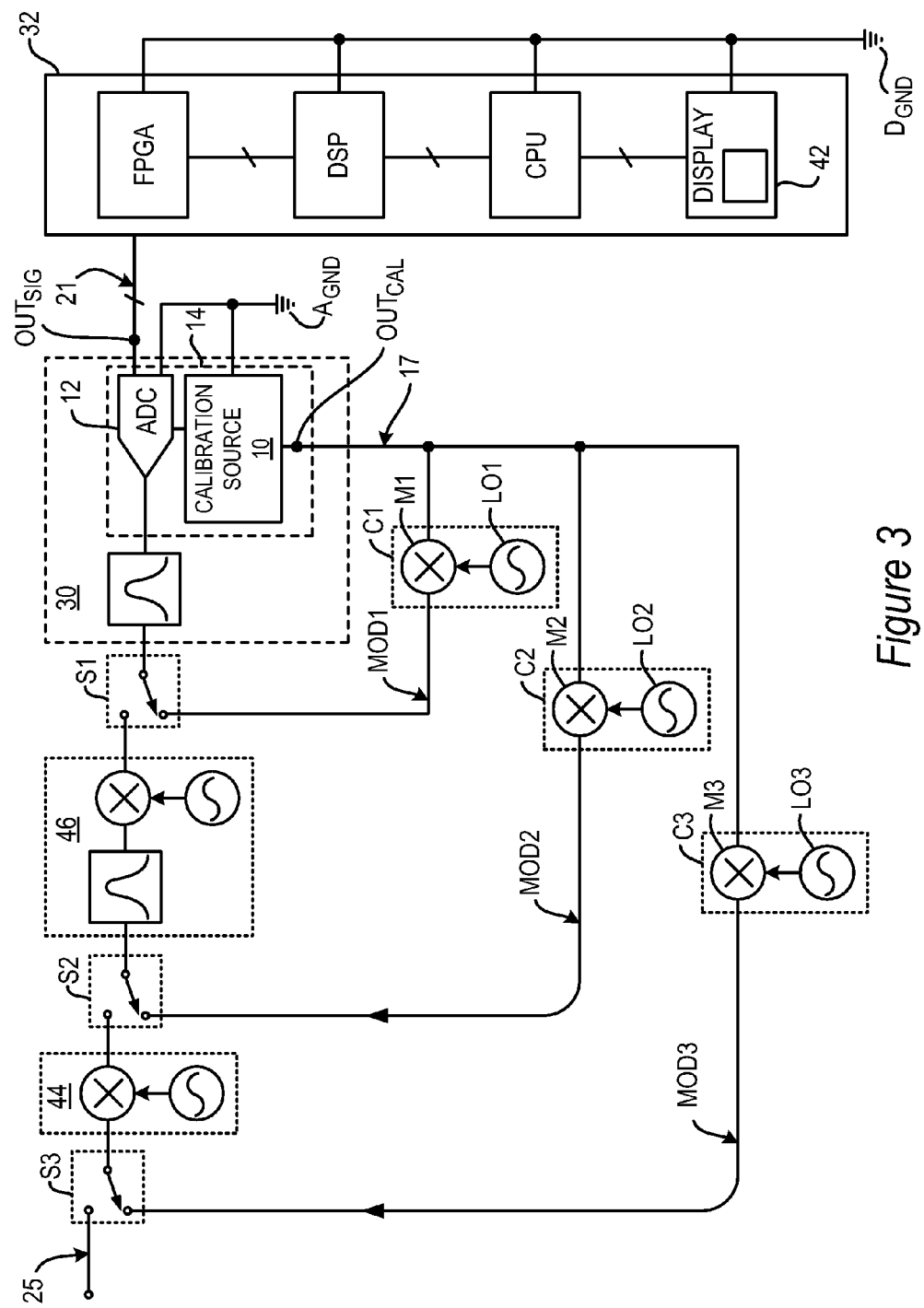
FIG. 3 shows one example of an integrated calibration source and ADC within a spectrum analyzer according to embodiments of the present invention.

FIG. 3 shows one example according to embodiments of the present invention wherein the integrated calibration source 10 and ADC 12 are included in the digital IF section 30 of an RF spectrum analyzer 40. The RF spectrum analyzer 40 has a digital processing unit 32 that receives, processes and displays digital signals 21 from the ADC 12 to provide a representation of the frequency spectra of analog signals 25 that are applied to the RF spectrum analyzer 40. The frequency spectra are represented on a display or other output device 42 included in the digital processing unit 32. FPGAs, digital signal processors (DSPs), central processing units (CPUs) and other digital circuitry within the digital processing unit 32 are referenced to a digital ground $D_{GND}$ that is isolated from the analog ground $A_{GND}$ of the integrated calibration source 10 and ADC 12. While the digital ground $D_{GND}$ is typically kept isolated from the analog ground $A_{GND}$ throughout the RF spectrum analyzer 40, the digital ground $D_{GND}$ and the analog ground $A_{GND}$ are connected at a common point in the power supply (not shown) of the RF spectrum analyzer 40.

The calibration signal 17 provided by the calibration source 10 is typically provided at the output $OUT_{CAL}$ of the calibration memory 16 of the calibration source 10 as a low voltage differential signal (LVDS) that is suitable for routing to a variety of subsystems within the RF spectrum analyzer 40. In FIG. 3, the calibration signal 17 is provided to one or more upconverters C1-C3 and then applied to the digital IF section 30, a first down-converter subsystem 46, and a front-end subsystem 44 of the RF spectrum analyzer 40. Each upconverter C1-C3 includes a corresponding local oscillator LO1-L03, and a corresponding mixer M1-M3 or other frequency translation device. Each of the upconverters C1-C3 modulates the calibration signal 17 about a corresponding carrier signal having a carrier frequency established by the frequency of the corresponding local oscillator, to form a corresponding modulated signal MOD1-MOD3. The modulated signals MOD1-MOD3 provided by the upconverters C1-C3 can be selectively coupled to designated subsystems of the RF spectrum analyzer 40 by a corresponding one of the switches S1-S3.

In one example, the calibration signal 17 provided by the calibration source 10 has a bandwidth of 600 MHz and the carrier frequency of local oscillator LO1 in the upconverter C1 is set to 600 MHz. This results in a modulated signal MOD1 that has a bandwidth of 1.2 GHz centered at 600 MHz. By coupling the modulated signal MOD1 to the digital IF section 30 of the RF spectrum analyzer 40 via switch S1, the modulated signal MOD1 with the frequency span of 2*BW is sufficiently broadband to stimulate the ADC 12 included in the digital IF section 30 over a measurement bandwidth for the digital IF section 30 that spans from 100 MHz to 1100 MHz.

When the calibration signal 17 has a comb spectrum 11 with teeth 15 of designated magnitudes and phases, the modulated signal MOD1 provided by the upconverter C1 also has a comb spectrum 11 with teeth 15 of the designated magnitudes and phases, centered about the carrier of the modulated signal MOD1. When measurements of the modulated signal MOD1 are acquired by the ADC 12 in the digital IF section 30, the ADC 12 provides a digital signal 21, which is a digital representation of the modulated signal MOD1, to the digital processing unit 32 of the RF spectrum analyzer 40. The digital representation provided by the digital signal 21 includes digital values that correspond to the time-varying magnitude of the modulated signal MOD1. The digital processing unit 32 receives these digital values and applies a Hilbert Transform or a complex digital down-conversion to the digital values to extract a measured magnitude and a measured phase corresponding to the modulated signal MOD1 as applied to the digital IF section 30. The digital processing unit 32 compares the measured magnitude and measured phase to the magnitude and phase of the modulated signal MOD1 and then synthesizes a calibration filter to compensate or otherwise accommodate for deviations or errors that result from the comparison. The calibration filter is then applied by the digital processing unit 32 to subsequent measurements acquired by the ADC 12 within the digital IF section 30 to calibrate the response of the digital IF section 30 of the RF spectrum analyzer 40.

The modulated signals MOD1, MOD2 in FIG. 3 are applied to other subsystems of the RF spectrum analyzer 40 in a similar fashion to the modulated signal MOD3 so that corresponding calibration filters can be synthesized to calibrate the responses of those subsystems. In the example shown in FIG. 3, the modulated signal MOD3 is applied via switch S3 to calibrate the magnitude and phase responses of the front-end subsystem 44 of the RF spectrum analyzer 40, and the modulated signal MOD2 is applied via switch S2 to calibrate the magnitude and phase responses of the first down-conversion subsystem 46 of the RF spectrum analyzer 40.

The calibration filters that are synthesized as a result of applying the modulated signals to the various subsystems of the RF spectrum analyzer 40 are typically non-symmetric complex filters that correct for the magnitude and phase responses of the various subsystems of the RF spectrum analyzer 40. Commercially available spectrum analyzers, such as the model E4440 PSA, Option 122, spectrum analyzer from AGILENT TECHNOLOGIES, INC provide examples of techniques for synthesizing calibration filters that are suitable for use in the RF spectrum analyzer 40.

While the embodiments of the present invention have been illustrated in detail, it should be apparent that modifications and adaptations to these embodiments may occur to one skilled in the art without departing from the scope of the present invention as set forth in the following claims.

The invention claimed is:

1. A system, comprising:
    an analog-to-digital converter referenced to an analog ground; and
    a calibration source integrated with the analog-to-digital converter on an integrated circuit and referenced to the analog ground, the calibration source providing a comb spectrum established by a sequence of bits that are repeatedly played back, wherein the calibration source includes a calibration memory storing the sequence of bits, and a memory controller coupled to the calibration memory providing for the playback of the sequence of bits to establish the comb spectrum.

2. The system of claim 1 wherein the analog-to-digital converter and integrated calibration source are included in a digital intermediate frequency (IF) section of an RF spectrum analyzer.

3. The system of claim 2 further comprising an upconverter that modulates the comb spectrum onto a carrier signal to provide a modulated signal that is applied to the digital IF section of the RF spectrum analyzer.

4. The system of claim 3 wherein the RF spectrum analyzer synthesizes a calibration filter based on a measured response of the digital IF section to the applied modulated signal.

5. The system of claim 2 further comprising an upconverter that modulates the comb spectrum onto a carrier signal to provide a modulated signal that is applied to a front-end subsystem of the RF spectrum analyzer.

6. The system of claim 5 wherein the RF spectrum analyzer synthesizes a calibration filter based on a measured response of the digital IF section to the applied modulated signal.

7. The system of claim 2 further comprising an upconverter that modulates the comb spectrum onto a carrier signal to provide a modulated signal that is applied to a first down-converter subsystem of the RF spectrum analyzer.

8. The system of claim 7 wherein the RF spectrum analyzer synthesizes a calibration filter based on a measured response of the digital IF section to the applied modulated signal.

9. A system, comprising:
    an analog-to-digital converter referenced to an analog ground; and
    a calibration source integrated with the analog-to-digital converter on an integrated circuit and referenced to the analog ground, the calibration source providing a comb spectrum having a designated bandwidth that is established by a sequence of bits that are repeatedly played back, wherein the integrated circuit is included a digital intermediate frequency (IF) section of an radio frequency (RF) spectrum analyzer.

10. The system of claim 9 wherein two times the designated bandwidth of the comb spectrum is sufficiently wide to calibrate at least one of a magnitude response and a phase response of the digital IF section of the RF spectrum analyzer.

11. The system of claim 10 wherein calibrating the at least one of the magnitude response and the phase response of the digital IF section of the RF spectrum analyzer includes synthesizing a calibration filter that is applied to measurements acquired by the RF spectrum analyzer.

12. The system of claim 9 wherein the calibration source includes a calibration memory storing the sequence of bits, and a memory controller coupled to the calibration memory providing for the playback of the sequence of bits to establish the comb spectrum.

13. The system of claim 9 further comprising an upconverter that modulates the comb spectrum onto a carrier signal to provide a modulated signal that is applied to the digital IF section of the RF spectrum analyzer.

14. The system of claim 9 further comprising further comprising an upconverter that modulates the comb spectrum onto a carrier signal to provide a modulated signal that is applied to a front-end subsystem of the RF spectrum analyzer.

15. The system of claim 9 an upconverter that modulates the comb spectrum onto a carrier signal to provide a modulated signal that is applied to a first down-converter subsystem of the RF spectrum analyzer.

16. A system, comprising:
an analog-to-digital converter referenced to an analog ground; and
a calibration source integrated with the analog-to-digital converter on an integrated circuit and referenced to the analog ground, the calibration source providing a comb spectrum established by a sequence of word patterns that are provided to at least one digital-to-analog converter, wherein the calibration source includes a calibration memory storing the sequence of word patterns, and a memory controller coupled to the calibration memory providing for the playback of the sequence of word patterns to establish the comb spectrum.

17. The system of claim 16 wherein the analog-to-digital converter and integrated calibration source are included in a digital intermediate frequency (IF) section of an RF spectrum analyzer.

18. The system of claim 16 further comprising an upconverter that modulates the comb spectrum onto a carrier signal to provide a modulated signal that is applied to the digital IF section of the RF spectrum analyzer.

* * * * *